United States Patent [19]
Taniguchi et al.

[11] Patent Number: 5,662,999
[45] Date of Patent: Sep. 2, 1997

[54] MOLD AND METHOD OF MANUFACTURING THE SAME

[75] Inventors: Yasushi Taniguchi, Kawasaki; Tetsuo Kuwabara, Urawa; Masaaki Yokota, Sagamihara, all of Japan

[73] Assignee: Canon Kabushiki Kaisha, Tokyo, Japan

[21] Appl. No.: 336,106

[22] Filed: Nov. 4, 1994

[30] Foreign Application Priority Data

Nov. 15, 1993 [JP] Japan .................. 5-284721

[51] Int. Cl.⁶ .................. C03C 23/00; B30B 15/00
[52] U.S. Cl. .................. 428/408; 428/216; 428/336; 428/457; 428/698; 428/701; 428/702; 428/704; 65/60.6; 65/374.15
[58] Field of Search .................. 428/408, 698, 428/704, 336, 457, 472, 216; 65/60.6, 374.15

[56] References Cited

U.S. PATENT DOCUMENTS

| | | | |
|---|---|---|---|
| 4,935,303 | 6/1990 | Ikoma et al. | 428/408 |
| 5,026,415 | 6/1991 | Yamamoto et al. | 65/305 |
| 5,032,159 | 7/1991 | Kuwabara et al. | 65/64 |
| 5,202,156 | 4/1993 | Yamamoto et al. | 427/135 |
| 5,380,349 | 1/1995 | Taniguchi et al. | 65/286 |

FOREIGN PATENT DOCUMENTS

| | | | |
|---|---|---|---|
| 49-51112 | 5/1974 | Japan . | |
| 52-45613 | 4/1977 | Japan | C23C 23/20 |
| 60-246230 | 12/1985 | Japan | C03B 11/00 |
| 61-183134 | 8/1986 | Japan | C03B 11/08 |
| 61-281030 | 12/1986 | Japan | C03B 23/00 |
| 64-83529 | 3/1989 | Japan | C03B 11/00 |
| 1301864 | 12/1989 | Japan | C23C 16/44 |
| 2-31012 | 7/1990 | Japan | C03B 11/00 |

*Primary Examiner*—Archene Turner
*Attorney, Agent, or Firm*—Fitzpatrick, Cella, Harper & Scinto

[57] ABSTRACT

A mold used for press-molding precision parts, such as an optical element formed of glass. A carbon film is formed at least on the molding surface of a matrix of the mold via an intermediate layer or without such a layer. The carbon film is shaped with a carbon ion beam having a desired ion energy such that a plurality of projections having an average height of from 0.5 to 30 nm are arranged at an average pitch of from 5 to 30 nm. Such a shape of the carbon film decreases the surface energy and frictional coefficient of the film and increases adhesion strength of the film to the matrix without impairing the surface roughness of an optical element to be molded. Thus, a resultant mirror surface of the mold is highly durable, free from film peeling and cracks in the formation of glass.

19 Claims, 8 Drawing Sheets

MOLD AND METHOD OF MANUFACTURING THE SAME

BACKGROUND OF THE INVENTION

1. Field of the Invention

The present invention relates to a mold and a method of manufacturing the same. More specifically, the invention relates to a mold suitable for manufacturing precision parts such as optical elements formed of glass, as for example, a lens and a prism, by press-molding glass materials, and to a method of manufacturing such a mold. Particularly, the invention relates to a mold having a carbon film formed thereon, provided with a mirror surface having minimum defects, free from film peeling and cracks, and also relates to a method of manufacturing such a mold.

2. Description of the Related Art

A technique for press-molding materials, such as glass materials, is known as a method of manufacturing precision parts, typically, optical elements such as lenses, which do not require a polishing process, or require only an extremely short polishing process.

Such a technique eliminates complicated processes, such as a polishing process required for conventional manufacturing, or it significantly shortens such processes, thus enabling simple production of lenses at low cost. Hence, today, such a technique is coming into use for manufacturing precision parts, typically, optical elements, such as lenses, prisms and other types of glass articles.

A mold used for press-molding glass optical elements requires good characteristics, such as hardness, heat resistance, releasability and mirror-surface processing characteristics. For a mold of this type, many proposals have been made using metals, ceramics, and materials coated with such metals and ceramics. Examples of such molds are: 13Cr martensite steel in Japanese Patent Laid-Open No. 49-51112, SiC and $Si_3N_4$ in Japanese Patent Laid-Open No. 52-45613, a material obtained by coating a superhard alloy coated with a noble metal in Japanese Patent Laid-Open No. 60-246230, a thin diamond film and a diamond like carbon film in Japanese Patent Laid-Open Nos. 61-183134, 61-281030 and 1-301864, a hard carbon film in Japanese Patent Laid-Open No. 64-83529, a material coated with a carbon film in Japanese Patent Laid-Open No. 64-83529, and a material coated with a carbon film in Japanese Patent Publication No. 2-31012.

However, 13Cr martensite steel is likely to oxidize and Fe is diffused in glass at high temperatures, thus causing glass to be colored. Although SiC and $Si_3N_4$ are generally considered unlikely to oxidize, they do oxidize at high temperatures and a $SiO_2$ film is formed on the surface, causing glass to adhere to the mold. Moreover, the mold has extremely poor processing characteristics due to its high level of hardness. It is unlikely that a material coated with a noble metal allows glass to stick to the mold, but the surface of the mold is extremely soft so that it is easily scratched and deformed.

In contrast, a thin diamond film has a high level of hardness and superior heat stability. Nevertheless, since the thin film is polycrystalline, the surface of the film is extremely rough, and needs to be mirror-processed. Molds using a DLC (diamond like carbon) film, a-C:H (hydrogenated amorphous carbon) film and a hard carbon film exhibit good releasability between the molds and glass, thus avoiding having glass adhere to the molds. However, after molding is performed hundreds of times or more, the film might be partially peeled and a resultant molding might fail to perform sufficient molding.

This may result because of the following three reasons.

(1) All the foregoing films have an extremely large compressive stress, and film peeling and cracks occur due to stress relief along with rapid heating and cooling during the molding process. Similar symptoms can be seen due to a disparity of heat expansion efficiency between the matrix and the film and due to heat stress caused by a heat cycle.

(2) There are some cases where the film cannot be entirely formed, or, even though it is formed, the thickness of the film is thin, depending on the surface condition of the matrix. For example, the matrixes obtained by using sintered bodies, such as WC-Co, SiC and $Si_3N_4$, cannot avoid crystal grains missing and pores from being produced in the course of sintering, thus resulting in holes of a few μm or greater forming on the polished molding surface. In the formation of a film on such a surface, the film cannot be formed on the portions with the above-mentioned holes, or even if it is formed, the film is extremely thin. Adhesion strength of such portions of the film and mechanical strength thereof are considerably lowered, and accordingly, film peeling and cracks are likely to occur starting from the portions with the holes.

(3) An alloy is formed between a sintering aid in a sintered body, typified by Co in WC-Co, and the above-mentioned film, due to diffusion. Glass adheres to the portion having the alloy and the alloy reacts with components contained in glass, thus producing precipitates, resulting in a decrease in durability.

As described above, although the mold simply employs a carbon film, a thin diamond film, a DLC film, a a-CiH film, and a hard carbon film, there is still room for improvement in order to realize a mold which is suitable for molding optical elements and which is superior in all conditions, such as molding characteristics, durability and cost efficiency.

Japanese Patent Publication No. 2-31012 discloses that a film having a thickness of less than 50Å becomes inconsistent, thus reducing the practical effects of forming the carbon film, while a film having a thickness of more than 5000Å increases profile irregularities by pressure molding. In contrast, a film having a thickness within a range from 50 to 5000Å does not present any problem. However, the carbon film in the embodiment of this patent publication is likely to peel in the molding process due to a slight adhesion to the base or due to a large compressive stress. This causes glass to adhere to the peeled portions, thereby spoiling the outer appearance of a resultant molding. Therefore, it is desirable to provide a practical mold having superior durability.

SUMMARY OF THE INVENTION

Accordingly, in view of the foregoing problems, an object of the present invention is to provide a mold exhibiting good molding characteristics, durability and cost efficiency, the mold being particularly suitable for molding optical elements, and also to provide a method of manufacturing such a mold.

Another object of the present invention is to provide a mold with a molding surface coated with a film that is free from peeling and cracks, as is found to be peculiar to conventional coating films, such as carbon films, thereby preventing an adverse influence on a material to be molded, and also to provide a method of manufacturing such a mold.

Still another object of the present invention is to provide a mold which prevents a material from adhering to the mold so as not to spoil the outer appearance of precision parts, such as optical elements, and to provide a method of manufacturing such a mold.

A further object of the present invention is to provide a mold free from problems which might be caused by a heat cycle in the course of molding, and also to provide a method of manufacturing such a mold.

Still a further object of the present invention is to provide a mold having a highly durable mirror surface on the molding surface, and also to provide a method of manufacturing such a mold.

An even further object of the present invention is to provide a mold which improves the overall productivity and yield and realizes cost reduction, and also to provide a method of manufacturing such a mold.

A further object of the present invention is to provide a simple mold manufacturing method whereby a conventional film-forming device can be utilized.

A further object of the present invention is to provide a mold comprising a carbon film at least on a molding surface of the mold, the carbon film being formed such that a plurality of projections having an average height of from 0.5 to 30 nm are serially arranged on the molding surface at an average pitch of from 5 to 30 nm.

A further object of the present invention is to provide a method of manufacturing a mold, comprising the step of irradiating a molding surface of the mold with a carbon ion beam having an ion energy of from 5 to 25 keV so as to form a carbon film on which a plurality of projections having an average height of from 0.5 to 30 nm are arranged at an average pitch of from 5 to 30 nm.

A further object of the present invention is to provide a method of manufacturing a mold, comprising the steps of: surface-treating a surface corresponding to a molding surface of the mold so as to form the resultant surface on which a plurality of projections having an average height of from 0.5 to 30 nm are serially formed at an average pitch of from 5 to 30 nm; and forming a carbon film on which a plurality of projections having an average height of from 0.5 to 30 nm are serially arranged at an average pitch of from 5 to 30 nm by use of a carbon ion beam having an ion energy of from 0.2 to 1.5 keV.

Further objects, features and advantages of the present invention will become apparent from the following description of the preferred embodiments with reference to the attached drawings.

BRIEF DESCRIPTION OF THE DRAWINGS

FIGS. 6(a) and 6(b) show AFM image and surface roughness, respectively;

DETAILED DESCRIPTION OF THE PREFERRED EMBODIMENTS

Figure 1:
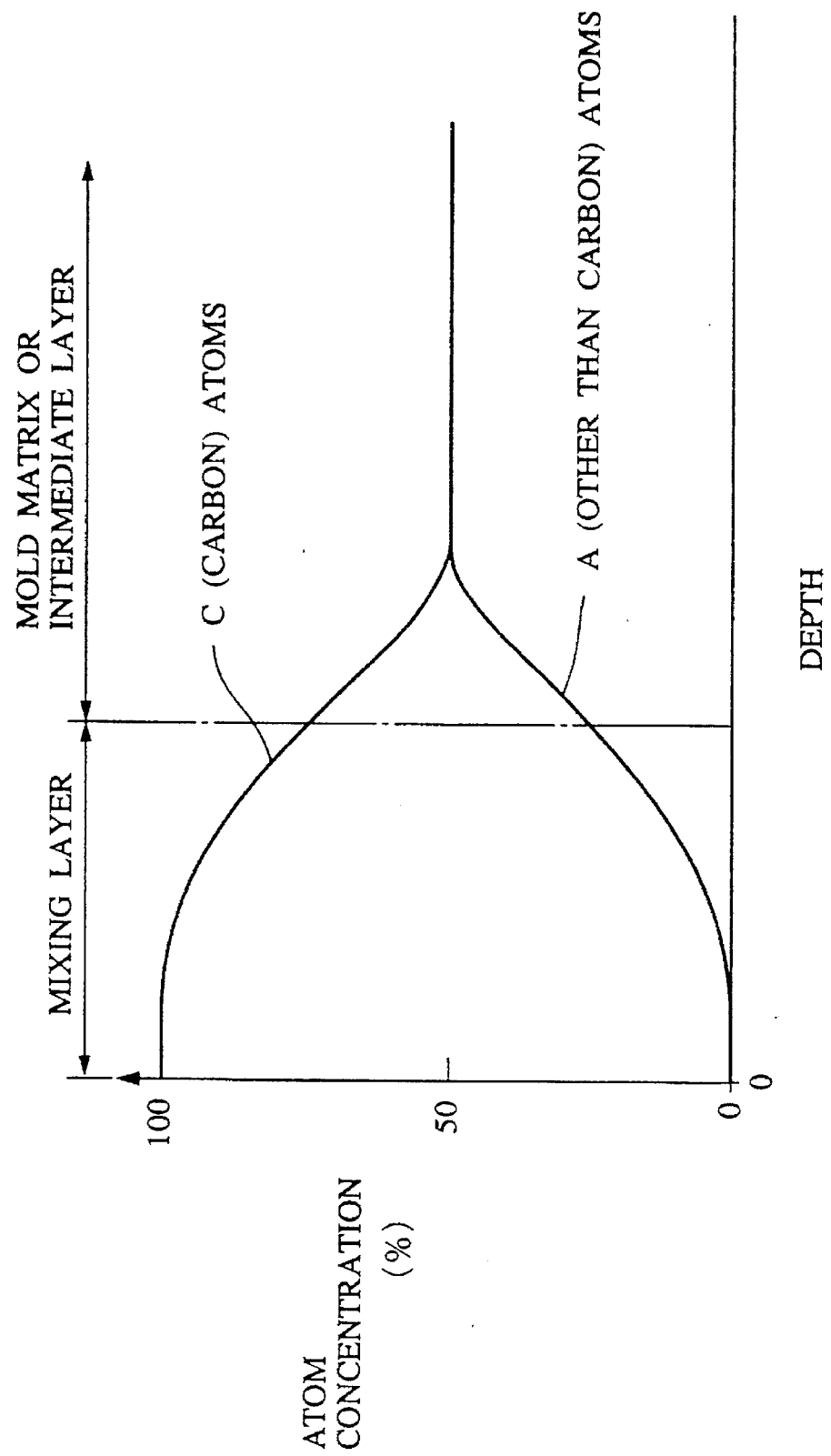
FIG. 1 is a schematic view of the atom mixing state of a mixing layer formed on the molding surface of a mold according to the present invention.

The present inventors were committed to a study of a mold which achieves the foregoing objects and exhibits superior performance, in addition to a study of a method of manufacturing such a mold. They discovered through numerous experiments, that the configuration of the molding surface of a mold is extremely important.

That is, the foregoing objects of the present invention are accomplished when the molding surface of a mold is formed so as to be serially provided with a plurality of projections of a desired height. Such a form is obtained by forming a portion of a molding surface of a matrix of a mold in such a way that it is serially provided with a plurality of projections of a preferred step and pitch, followed by forming a film according to a desired method.

The present invention will now be described in detail.

Materials used for a precision mold can generally be materials used for a mold matrix of the present invention, and more specifically, such materials can be selected from the group consisting of WC, SiC, TiC, TaC, BN, TiN, AlN, $Si_3N_4$, $SiO_2$, $Al_2O_3$, $ZrO_2$, W, Ta, Mo, cermet, SIALON (silicon-aluminum-oxide-nitride), mullite, WC-Co alloys, and the like.

Additionally, in the present invention, a coating film is formed on the foregoing matrix via an intermediate layer. Alternatively, a coating film is directly formed on the matrix without an intermediate layer. A carbon film is used as such a coating film.

Because carbon has low adhesion in relation to glass, carbon has been conventionally used for a glass mold. Making use of the characteristics of such carbon and glass, the glass mold is obtained by forming the foregoing hard and smooth carbon film on the molding surface of the matrix. As stated above, carbon films include a diamond film, a diamond-like carbon (DLC) film, an a-c:H film and a hard carbon film. Since the diamond film is polycrystalline and thus has a rough surface, it requires mirror-processing after being formed.

On the other hand, the DLC film, a-c:H film and hard carbon film, which are known as amorphous films, have large internal stress and lack heat stability in the high temperature range at which glass is molded. Hence, as has been discussed above, adhesion strength between the matrix and the film is decreased as the number of molding operations increases. This indicates that the problems inherent in using the carbon film as a material forming the molding surface of the glass mold are largely related to adhesion strength between the matrix and the film.

In order to solve the above-noted problems, for example, a plurality of projections having an average step of from 0.5 to 30 nm are formed on the molding surface of the matrix at an average pitch of from 5 to 30 nm. Then, a carbon film is formed on the resultant molding surface shaped as such.

The carbon film has the following basic properties. It has a small surface energy and a small frictional coefficient in relation to glass. By the measurements of an Atomic Force Microscope (AFM), the surface energy between the carbon film and a $Si_3N_4$ stylus was found to be smaller than 100 nN, and a frictional coefficient therebetween was 0.1 or less. The resultant mold has low adhesion in relation to glass and also has low reactivity with glass in the course of molding, thus realizing good molding, free from glass adhesion and reaction products.

Additionally, the present inventors proceeded with further study and concluded that the formed film has a deep transition state between such a film and a matrix or an intermediate layer material, thus having extremely high adhesion strength. In other words, if a deep transition state is obtained, the surface shape of the matrix or that of the intermediate layer has a degree of freedom.

Such a transition state is schematically shown in FIG. 1. In the film shown in FIG. 1, carbon atoms are mixed (atom mixture) at the interface of the matrix or the intermediate layer formed on the matrix (hereinafter, a carbon film having a gradient of carbon concentration is referred to as "a mixing layer", and the thickness of the mixing layer is defined as the depth from the surface of the film to the position in which the strength of carbon atoms [carbon concentration] is 50% of the total change across the interface between the film and the matrix or the intermediate layer. The state of the mixing layer is such that the concentration of carbon atoms is higher near the surface of the layer than that near the matrix, while the concentration of atoms other than carbon is higher near the matrix than near the surface of the layer. In FIG. 1, the horizontal axis indicates depth from the surface to the matrix, the position in the depth 0 being the surface of the layer, while the vertical axis shows atom concentration. In particular, the high carbon concentration on the surface is sufficient to ensure good releasability between the mold and glass, free from reaction precipitates with glass components.

The mixing state of respective atoms in the mixing layer shown in FIG. 1 is merely an illustration, and it may be linear or step-like shaped. That is, it may be any profile as long as it has a gradient of concentrations of C atoms and other types of atoms as described above. Thus, the profile is not limited to a single shape, but ideally, it is desired that, on the surface, the concentration of C atoms is 100%, while that of other atoms is 0%. The atom concentration in the matrix or in the intermediate layer does not have to be stoichiometric. It is certainly not necessary to contain carbon atoms in the matrix and in the intermediate layer.

Many experiments conducted by the inventors show that the configuration of a carbon film to be formed on the molding surface of the matrix or the intermediate layer is important in order to achieve the foregoing objects.

When a carbon film is provided with projections having a height (step) of greater than 30 nm at an average pitch of greater than 30 nm, the adhesion strength of the film in relation to the matrix or the intermediate layer is decreased. Moreover, the resultant configuration of the film is transferred to an optical element to be molded, whereby the surface roughness is thus deteriorated, and the optical element cannot be used. On the other hand, when a carbon film is provided with projections having an average height (step) of smaller than 0.5 nm at an average pitch of smaller than 5 nm, that is, when the film has a smooth surface, it is likely that the surface energy of the film is greater and adhesion strength thereof is smaller, and no particular problems occur in the course of molding.

In consideration of the above fact, a carbon film is preferably formed such that projections having an average height of from 0.5 to 30 nm are arranged at an average pitch of from 5 to 30 nm, and more preferably, an average height of approximately from 5 to 20 nm and an average pitch of approximately from 10 to 25 nm.

The configuration of the above-mentioned carbon film can be obtained not only by forming such a carbon film on a smooth matrix, but also by the following process: a plurality of projections having predetermined dimensions have been continuously arranged on the matrix, and then, a carbon film having a predetermined thickness is applied onto the matrix, thus forming the above-mentioned projections on the resultant mold. It should be noted that the surface characteristics of a typical matrix are such that the surface roughness (Rmax) is approximately of from 0.01–0.05 µm, being devoid of projections. The surface roughness (Rmax) of a carbon film generally formed on such a surface of the matrix is also approximately from 0.01–0.05 µm.

The thickness of the carbon film (mixing layer) is preferably from 1 nm to 100 nm. A film having a thickness smaller than 1 nm cannot achieve a sufficient mixing state and thus fails to obtain the foregoing effects, while a film having a thickness greater than 100 nm results in a rough surface, thus deteriorating molding performance and increasing film stress. As a result, slight peeling is inclined to occur in the course of molding. The preferable thickness falls within a range of from 20 nm to 50 nm. In addition to oxygen, hydrogen and nitrogen, other substances, such as Ar and F, used as material gases, may be present in the mixing layer. The preferable amounts of the above-noted gases which may be present in the mixing layer are as follows. The amount of hydrogen atoms to be contained is preferably 30 atomic % or lower, more preferably, is from 0.1 to 30 atomic %, and most preferably is from 1 to 20 atomic %. The amount of oxygen atoms, nitrogen atoms, Ar atoms or F atoms to be contained is preferably 15 atomic % or lower, more preferably, is from 0.1 to 15 atomic %, and most preferably, is from 1 to 10 atomic %.

The matrix ideally meets the following conditions. It obtains a stable mixing state, and it is formed of a mono-component element which is likely to bond with carbon (likely to form a carbide). At the same time, it has high mechanical strength at high temperatures, high surface hardness and superior oxidation resistance. An intermediate layer may alternatively be arranged on the molding surface of the matrix, thereby meeting the above-noted conditions. A material of the intermediate layer may be selected from the group consisting of: Si, Al, metals of the 4A, 5A and 6A groups of the periodical table; carbides, nitrides, carbonitrides, carboxides, carboxide nitrides, borides, and boronitrides of one of these metals; boron carbides and boron nitrides; and compounds and mixtures containing at least one thereof. Materials having high adhesion strength in relation to the matrix can be selected as materials of the intermediate layer. The required minimum thickness of the layer is sufficiently and preferably, approximately from 5 to 100 nm.

The carbon film of the present invention can be formed using a carbon ion beam having an ion energy of, preferably, from 5 to 25 keV. If an ion energy is less than 5 keV, the resultant carbon film has a small height (step) of projections on the surface, which is thus smooth, but has low film adhesion strength, thereby sometimes causing film peeling during molding. During the formation of the carbon film, the ion current density is preferably from 0.2 to 1.5 mA/cm². Ion current density less than 0.2 mA/cm² lengthens the time required for forming a film. On the other hand, ion current density greater than 1.5 mA/cm² deteriorates the surface roughness as the number of molding operations increases, though there is no problem concerning adhesion strength. Ion energy of greater than 25 keV is likely to produce a carbon film which is shaped to have projections having a height (step) of greater than 30 nm at an average pitch of greater than 25 nm. Ion energy of 5 keV or greater sufficiently produces satisfactory projections, but in practice, it may be preferably from 5 to 10 keV. If projections having a predetermined shape are formed on the matrix in advance, the matrix can be covered with a carbon film having a predetermined thickness (approximately 20 to 200 nm), in which case, it is sufficient to provide a preferable ion beam energy of approximately 0.2 to 1.5 keV.

The mixing layer can actively be formed by a process, such as ion beam deposition, ion plating, ion implantation, ion beam mixing, and the like. Gases used for mixing carbon include: hydrocarbons containing a carbon gas, such as methane, ethane, propane, ethylene, benzene and acetylene; halogenated hydrocarbons, such as methylene chloride, carbon tetrachloride, chloroform and trichloroethane; alcohols, such as methyl alcohol and ethyl alcohol; ketones, such as $(CH_3)_2CO$ and $(C_6H_5)_2CO$; gases, such as CO and $Co_2$; and mixtures of these gases with gases such as, $N_2$, $H_2$, $O_2$, $H_2O$ and Ar.

Figure 11:
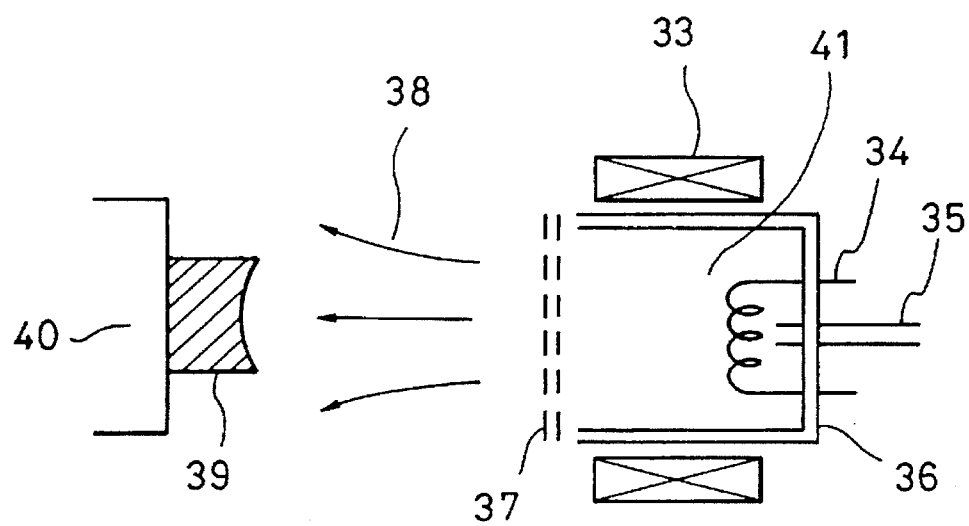
FIG. 11 is a schematic view of a Kaufmann-type ion source used for the formation of a mixing layer according to the present invention.

An explanation will now be given of the formation of a mixing layer using a carbon ion beam. The carbon ion beam is produced in a Kaufmann-type ion source, which is schematically shown in FIG. 11. FIG. 11 shows a cylindrical coil 33 for generating a magnetic field, a filament 34, a gas inlet 35, an anode 36, an induction electrode 37, an ion beam 38, a matrix 39 and a base holder 40 and an ionization chamber 41. The foregoing material gases, for example, $CH_4$ and $H_2$, are introduced into the ionization chamber 41 from the gas inlet 35, thus forming a plasma. Subsequently, a voltage is applied to the induction electrode 37 so as to induce an ion beam with which the matrix is then irradiated. Certain adjustments are made to form the mixing layer; for example, the positions of the ion source and the base are adjusted so that the induction voltage to the base is 5 kV or greater.

If the surface of the mold becomes rough and defects occur thereon through molding, a mixing layer (carbon film) is removed by a dry etching process and a new mixing layer is formed again, thereby allowing the reuse of the mold. This is feasible because defects caused by molding are substantially limited to the mixing layer and does not reach as far as the matrix. As an etching method according to a dry etching process, the following types of etching are available: plasma etching, sputter etching, ion beam etching, and reactive ion etching. As etching gases, $O_2$, $H_2$, $N_2$, Ar, Air, $CF_4$, and other kinds of gases, and a gas mixture of these gases, are used. Etching conditions are preferably selected so as not to deteriorate surface configuration, particularly, surface roughness, of the mold, in consequence of etching. A method of removing the film is not restricted to a dry process, but, may be performed by a combination of such a dry process and other processes such as mechanical-polishing using diamond abrasive grains and chemical etching.

The foregoing description of the present invention can be summarized as follows.

A carbon film formed at least on the molding surface of the matrix via an intermediate layer (or without such a layer), is given a specific configuration such that a plurality of projections having an average height of from 0.5 to 30 nm are serially arranged at an average pitch of from 5 to 30 nm. Such a configuration decreases the surface energy and the frictional coefficient of the film and increases the adhesion strength thereof in relation to the matrix. The surface roughness of a resultant molding, such as an optical element, is not deteriorated, and a material, such as glass, can also be prevented from adhering to the mold, thus avoiding reaction products between such a material and the mold, thereby maintaining releasability therebetween for a long period. As a result, a mold provided with a highly-durable mirror surface free from film peeling and cracks in the course of molding a material, such as glass, can be obtained.

Also, it is preferable that a carbon film has a thickness of from 1 to 100 nm and has a gradient of carbon atom concentration which is higher adjacent to the surface and lower adjacent to the matrix. The higher concentration of carbon atoms near the surface inhibits reaction precipitates with a material, such as glass components, thus enhancing releasability between the mold and such a material.

A carbon film is formed on the matrix via an intermediate layer or without such a layer, using a carbon ion beam having an ion energy of from 5 to 25 keV, thereby enhancing the efficient formation of a carbon film serially provided with specifically-shaped projections.

Alternatively, it is possible to provide similarly-shaped projections for the molding surface through a relatively thin carbon film according to the following process. A plurality of projections having an average step of from 0.5 to 30 nm have been serially arranged on the surface of the matrix at an average pitch of from 5 to 30 nm, that is, specifically-shaped projections have been formed on the matrix. Then, a carbon film is formed on the resultant matrix via an intermediate layer (or without such a layer), preferably, using a carbon ion beam having an ion energy of from 0.2 to 1.5 keV.

The present invention is not exclusive to optical elements, such as lens, mirror, grating and prism, it may also applicable to glass and plastic moldings other than optical elements.

The present invention will now be described by way of specific examples with reference to the drawings.

FIRST EXAMPLE

Figure 2:
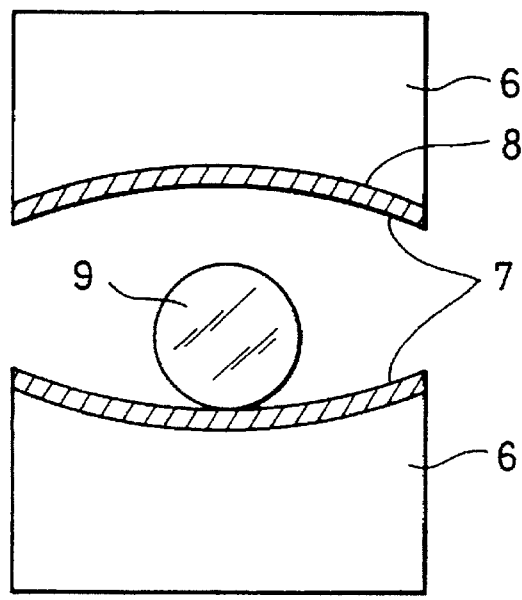
FIG. 2 is a sectional view of one example of a mold before press-molding a material according to the present invention.
Figure 3:
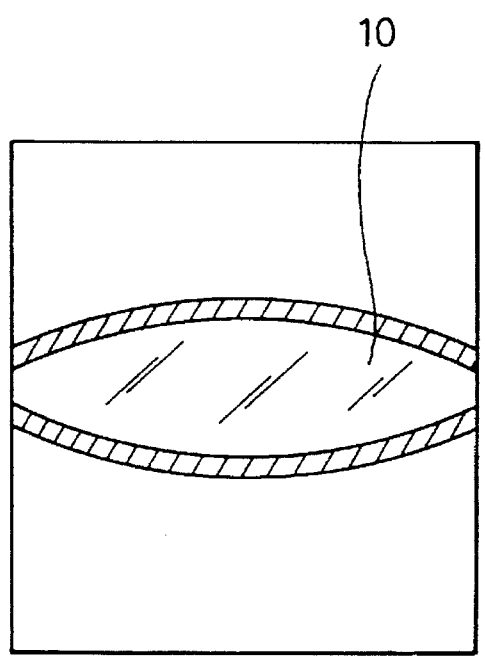
FIG. 3 is a sectional view of one example of an optical element mold after performing press-molding according to the present invention.

FIGS. 2 and 3 illustrate one example of a mold for molding an optical element according to the present invention. FIG. 2 shows the press-molding surface of the mold for an optical element, while FIG. 3 shows the optical element after being molded. The mold includes a pair of matrixes 6, molding surfaces 7 for molding a glass material, and carbon mixing layers 8. A glass material 9 is also shown in FIG. 2. An optical element 10 is shown in FIG. 3. As illustrated in FIG. 3, the glass material 9 placed between a pair of matrixes 6 is pressed, followed by removing the mold, thereby forming the optical element 10, such as a lens.

A detailed description will now be given of an optical element mold of this example.

Figure 4:
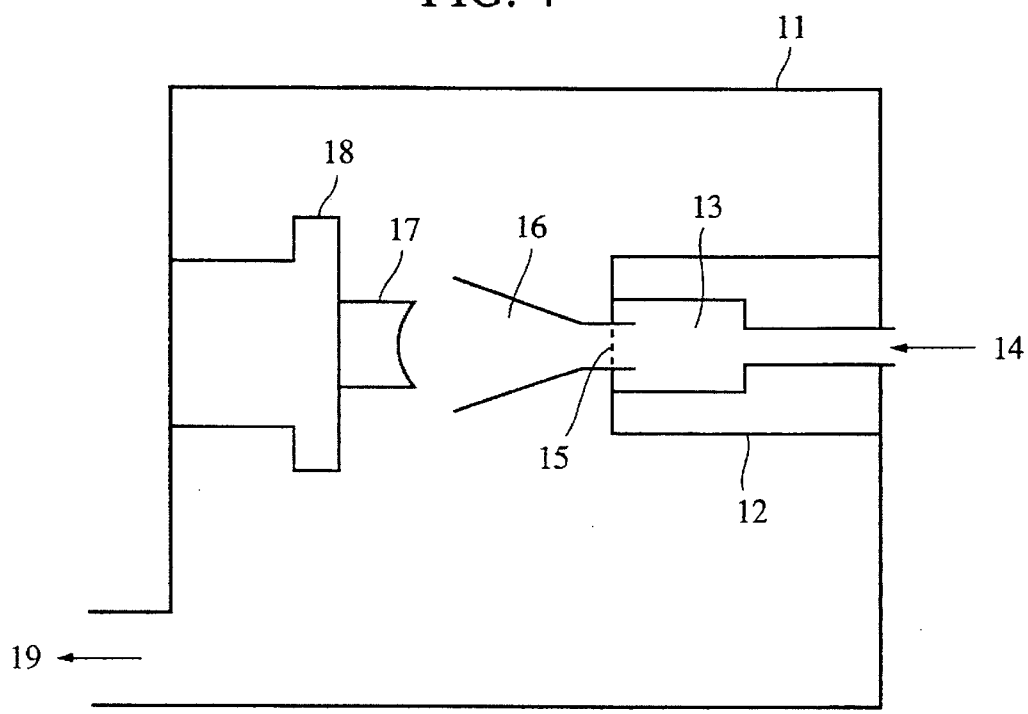
FIG. 4 is a schematic view of an Ion Beam Deposition (IBD) device used for an embodiment of the present invention.

Sintered SiC was machined to a predetermined configuration as a matrix, and a polycrystalline SiC film was formed according to a CVD process, followed by mirror-polishing the molding surface of the film. After the resultant mold was sufficiently washed, it was placed in an IBD (Ion Beam Deposition) device shown in FIG. 4. FIG. 4 illustrates a vacuum tank 11, an ion beam device 12, an ionization chamber 13, a gas inlet 14, an ion beam induction grid 15, an ion beam 16, a matrix 17, a base holder and a heater 18 and an evacuation vent 19. 35 sccm of an Ar gas was first introduced to the ionization chamber 13 from the gas inlet 14 so as to be ionized. Then, a voltage of 500 V was applied to the ion beam induction grid 15 so as to induce an ion beam. The matrix was irradiated with such an ion beam for three minutes so that the molding surface of the matrix had a natural oxidation film removed and then washed.

Figure 5:
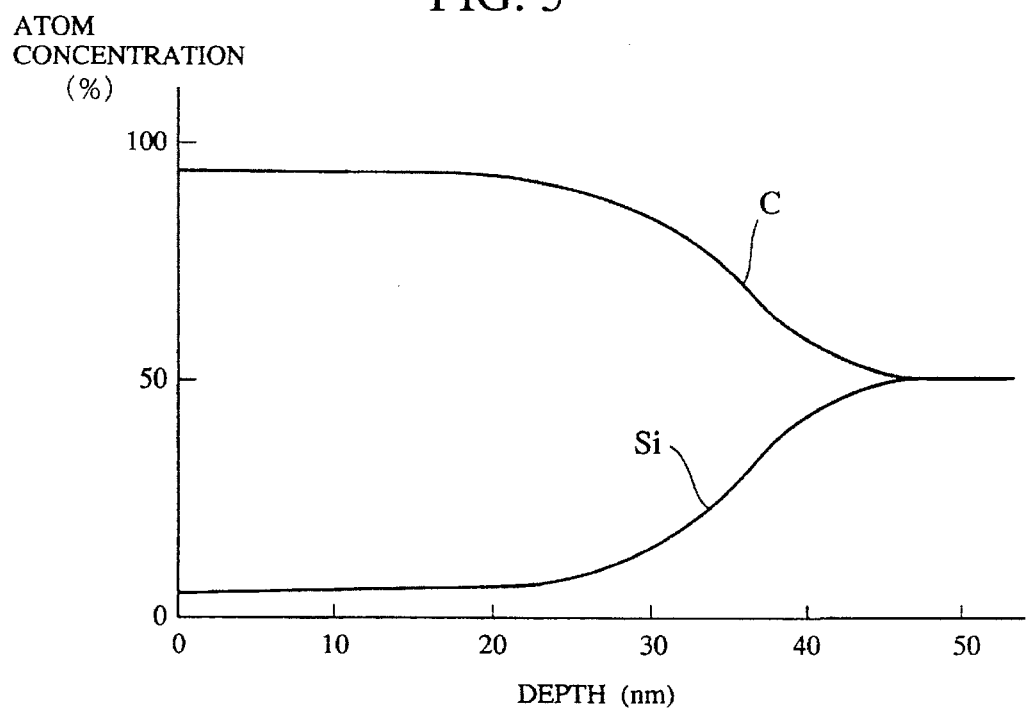
FIG. 5 illustrates the depth profile of a mixing layer observed by an Auger Electron Spectroscopy (AES) according to an embodiment of the present invention.

Subsequently, 16 sccm of $CH_4$ and 30 sccm of $H_2$ were introduced into the ionization chamber 13 which was pressurized to a gas pressure of $3.6 \times 10^{-4}$ Torr. An ion beam was introduced at an acceleration voltage of 8 kV and the molding surface was thus irradiated with the ion beam, thereby forming carbon film having a thickness of 40 nm. The current density of the ion beam measured 1.5 mA/cm$^2$ by a movable Faraday cup placed in front of the base. The distance between the base and the ion-source induction grid 15 was set to be 100 mm and the base was set at room temperature. A carbon film of an analysis sample formed under the same conditions as those of the above-noted film was analyzed in the depthwise direction with an AES (Auger Electron Spectroscopy), the results being shown in FIG. 5. As is clearly seen from FIG. 5, the thickness of the mixing layer is 40 nm, and the concentration of carbon C decreases from 96% detectable on the surface of the layer as the depth of the film increases toward the matrix, while the concentration of Si atoms increases from 5% detectable on the surface of the layer as the depth of the film increases toward the matrix. That is, the profile of the C and Si concentration of the film in the depthwise direction is illustrated in FIG. 5. The matrix has a SiC stoichiometry in which the concentration of both C and Si is 50%. The thickness of the mixing layer is from the surface of the film to the depth at which the C concentration changes from the maximum 96% to the minimum 50%, across the interface between the layer and the matrix.

Figure 6A:
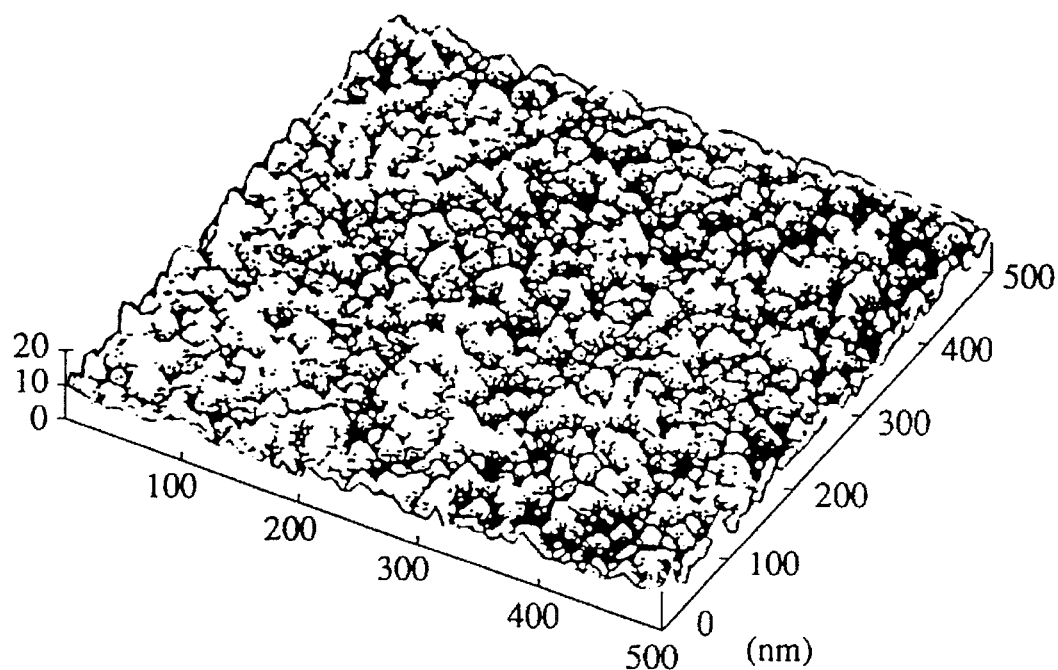
FIGS. 6(a) and 6(b) illustrate a carbon film observed by an Atomic Force Microscope (AFM) according to an embodiment of the present invention.
Figure 6B:
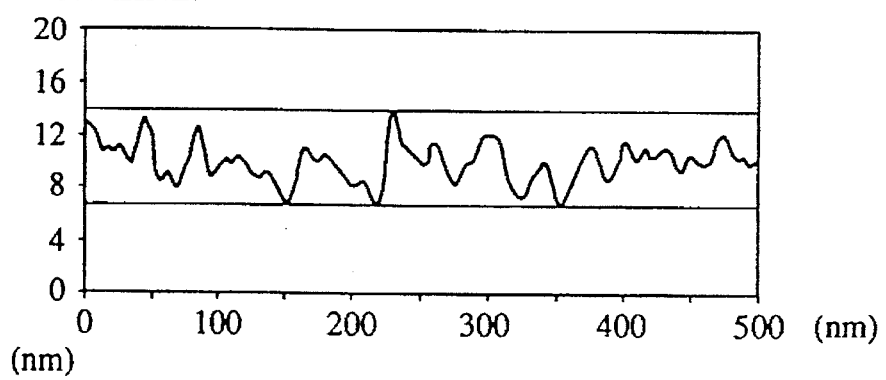

Similarly, FIG. 6(a) illustrates the carbon film observed with an Atomic Force Microscope (AFM). FIG. 6(a) shows the structure of the film surface such that approximately 20 projections were detectable at an average pitch of approximately 25 nm after being scanned over 500 nm of the surface, and the height of the projections was smaller than approximately 15 nm. The surface energy between the carbon film and a $Si_3N_4$ stylus was very small, such as approximately 10 nN. The surface roughness of the carbon film is shown in FIG. 6(b).

Figure 7:
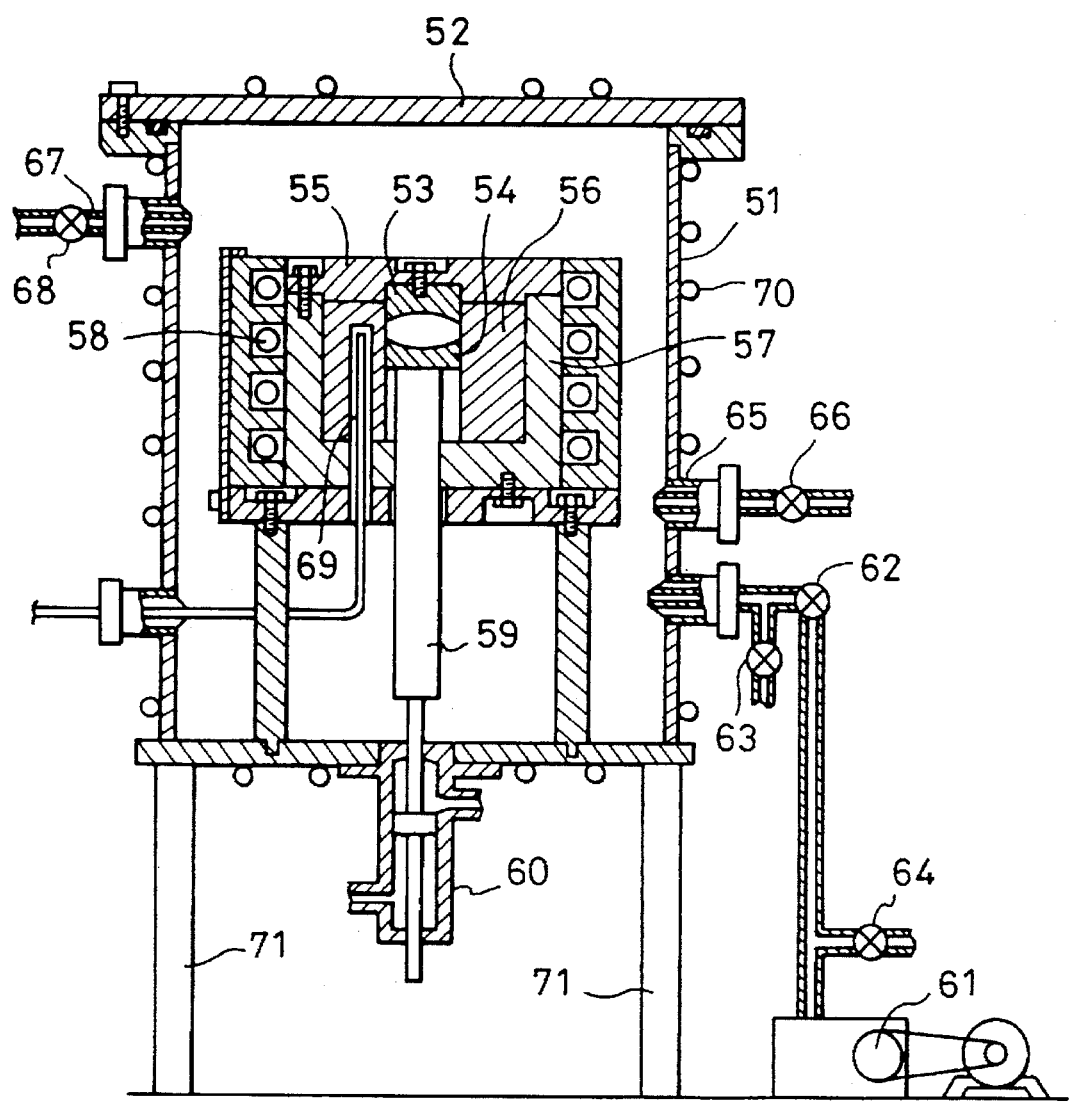
FIG. 7 is a schematic sectional view of a non-continuous type lens molding device using the optical element mold of the present invention.

An example will now be given of a glass lens being press-molded by the optical element mold according to the present invention. FIG. 7 indicates a vacuum tank 51, a cover 52 for the tank 51, an upper mold 53 for molding an optical element, a lower mold 54 for molding an optical element, an upper mold holding portion 55, body 56, a mold holder 57, a heater 58, a pressing-up bar 59 for pressing up the lower mold 54, a pneumatic cylinder 60 for actuating the pressing-up bar 59, a rotary oil pump 61, valves 62, 63 and 64, an inactive gas flowing pipe 65, a nitrogen gas valve 66, a leak valve 67, a valve 68, a temperature sensor 69, a water-cooling pipe 70, and a support 71 for supporting the vacuum tank 51.

A process for forming a lens will now be explained.

Figure 8:
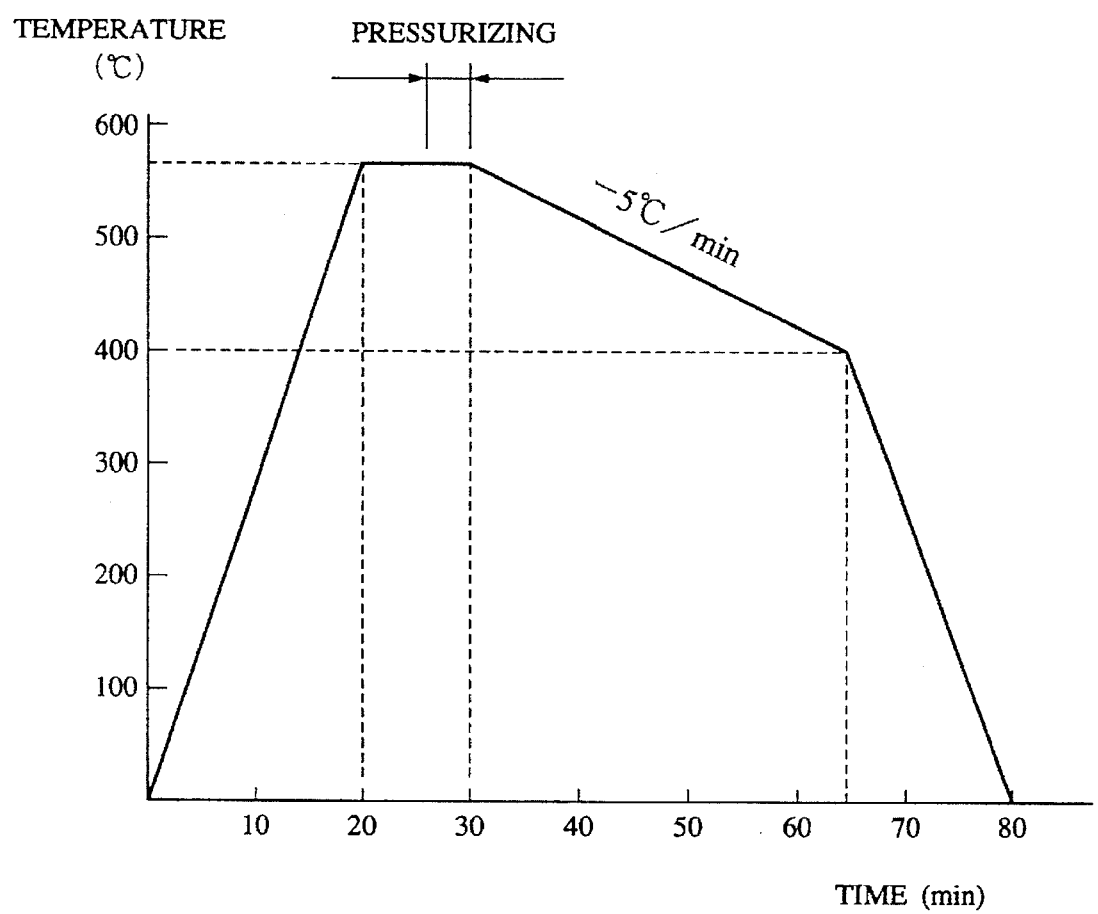
FIG. 8 illustrates one example of the time-temperature relationship in the lens molding performed by the molding device shown in FIG. 7.

The flint optical glass (SF14) was adjusted to a predetermined volume and formed to be a spherical shape. The resultant glass material was placed in a cavity of the mold and set in the molding device. After the mold having the glass material loaded thereinto was placed in the device, the cover 52 for the vacuum tank 51 was closed. Water was allowed to flow in the water-cooling pipe 70 and a current was also permitted to flow in the heater 58. Simultaneously, the nitrogen gas valves 66 and 68 were closed and the evacuation valves 62, 63 and 64 were also closed. The rotary oil pump 61 was rotated at all times. The valve 62 was opened to start evacuation until the pressure was reduced to $10^{-2}$ Torr or lower, and at this time, the valve 62 was closed and the valve 66 was opened to introduce a nitrogen gas into the vacuum tank 51 from a compressed-air cylinder. When the vacuum tank 51 reached a predetermined temperature, the pneumatic cylinder 60 was actuated to pressurize the vacuum tank 51 at a pressure of 200 kg/cm$^2$ for one minute. After the pressure was released, the vacuum tank 51 was cooled to a transition point or lower at a speed of $-5°$ C./minute, and further cooled at a speed of $-20°$ C./minute or higher. When the temperature was decreased to 200° C. or lower, the valve 66 was closed and the leak valve 63 was opened to introduce air to the vacuum tank 51. Then, the cover 52 was opened and the upper mold holding portion 55 was removed so as to take out a resultant mold. In this manner, the flint optical glass SF14 (having a softening point Sp of 586° C. and a transition point Tg of 485° C.) was used to mold the lens 10 illustrated in FIG. 3. The molding conditions, that is, the time-temperature relationship is illustrated in FIG. 8.

Molding was performed 500 times using the foregoing mold, which was then observed with an optical microscope and a scanning electron microscope (SEM). No defects, such as scratches and cracks, were detectable on the mold. Moreover, Pb, which was reduced and precipitated from PbO contained in the glass, nor was any glass adhering to the mold detectable. Further, the resultant molding had suitable surface roughness, less profile irregularity, and good permeability and configuration precision, free from Pb precipitation and gas remainders during molding.

Figure 9:
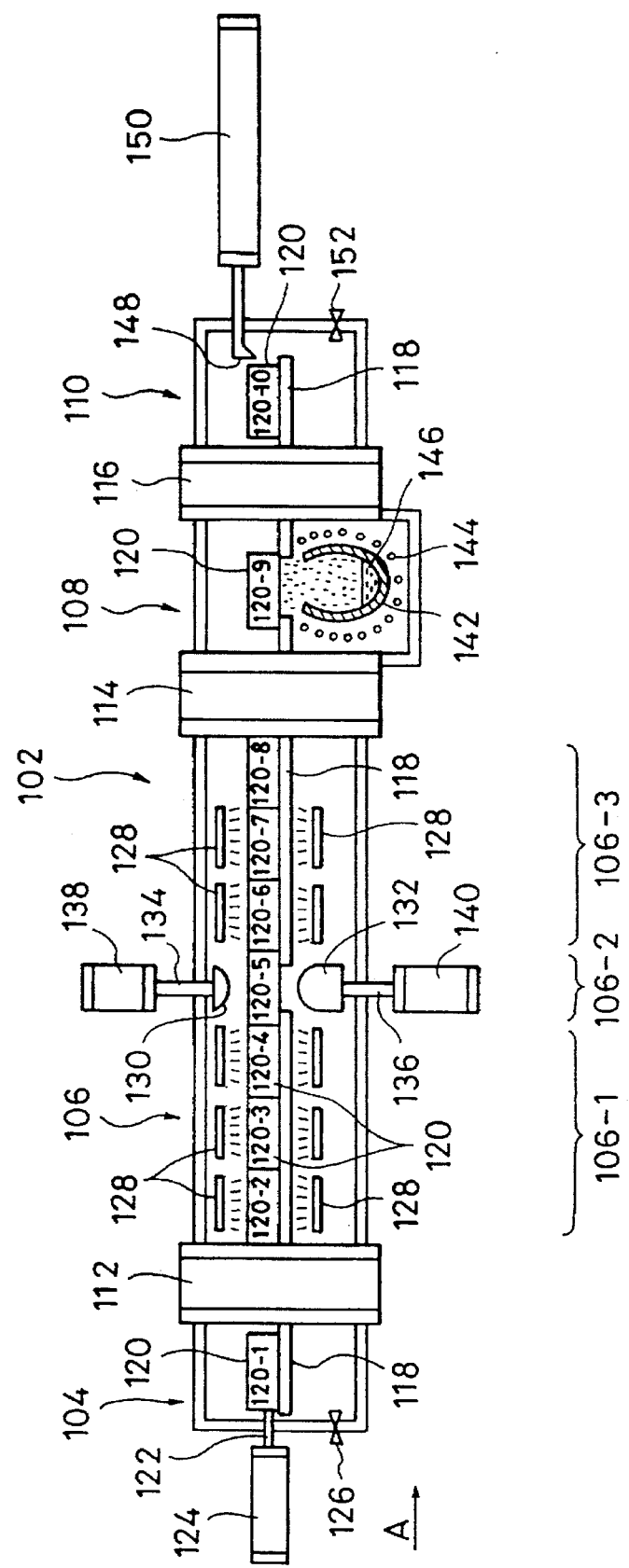
FIG. 9 is a schematic sectional view of a continuous type lens molding device using the optical element mold of the present invention.

Molding was performed using such a mold by a molding device shown in FIG. 9. A molding device generally denoted by 102 comprises an inlet substitution chamber 104, a molding chamber 106, a deposition chamber 108 and an outlet substitution chamber 110. The molding device 102 also includes gate valves 112, 114 and 116, a rail 118, a pallet 120 being fed on the rail 118 in the direction indicated by the arrow A, cylinders 124, 138, 140 and 150, valves 126 and 152, and heaters 128 arranged along the rail 118 in the molding chamber 106. The molding chamber 106 is divided into a heating zone 106-1, a pressing zone 106-2 and a gradual-cooling zone 106-3 sequentially arranged along the feeding direction of the pallet 120. In the pressing zone 106-2, an upper mold portion 130 is mounted on the bottom of a rod 134 of the cylinder 138, while a lower mold portion 132 is mounted on the bottom of a rod 136 of the cylinder 140. Such upper and lower mold portions 130 and 132 are molding portions according to the present invention. A container 142 for accommodating a deposition material 146 and a heater 144 for heating the container 142 are placed in the deposition chamber 108.

Crown glass SK12 (having a softening point Sp of 672° C. and a glass transition point Tg of 550° C.) was toughened to a predetermined shape and dimensions so as to obtain a molding blank. The resultant glass blank was placed in the pallet 120 and introduced into the position 120-1 within the inlet substitution chamber 104. The pallet 120 in that position 120-1 was pressed in the direction indicated by the arrow A by a rod 122 of the cylinder 124 so as to be fed to the position 120-2 within the molding chamber 106 through the gate valve 112. Likewise, a new pallet 120 within the inlet substitution chamber 104 is sequentially fed to the positions 120-2 →. . . →120-8 within the molding chamber 106 at a predetermined timing. Meanwhile, the glass blank was gradually heated by heaters 128 in the heating zone 106-1 so as to be raised to a softening point or higher in the position 120-4. The glass blank was further fed to the pressing zone 106-2 in which the cylinders 138 and 140 were actuated to press the glass blank for one minute at a pressure of 200 kg/cm² and a press temperature of 620° C. by the upper and lower mold portions 130 and 132. Thereafter, the pressure was released and the glass blank was cooled to a glass transition point or lower, and then, the cylinders 138 and 140 were actuated to release the upper and lower mold portions 130 and 132 from a resultant glass molding. During the foregoing pressing, the pallet 120 was used as a molding body. After pressing, the glass molding was gradually cooled in the gradual-cooling zone 106-3 of the molding chamber 106, which was filled with an inactive gas. The pallet 120 reaching the position 120-8 within the molding chamber 106 was fed through the gate valve 114 into the position 120-9 within the deposition chamber 108 in which the vacuum deposition would generally be performed (the deposition was not performed in this example). The glass molding was fed to the position 120-10 within the outlet substitution chamber 110 through the gate valve 116. Then, the cylinder 150 was actuated to remove the glass molding to the exterior of the molding device 102 by means of a rod 148.

Molding was performed 3000 times using this mold according to the foregoing pressing process to show that the molding surface of the mold and the resultant optical element had suitable surface roughness and good releasability. The molding surface of the mold was observed with an optical microscope and a scanning electron microscope (SEM), and no defects, such as scratches and cracks, were detectable. Moreover, reaction precipitates obtained from glass components and glass adhering to the mold were also not detectable.

SECOND EXAMPLE

Figure 10:
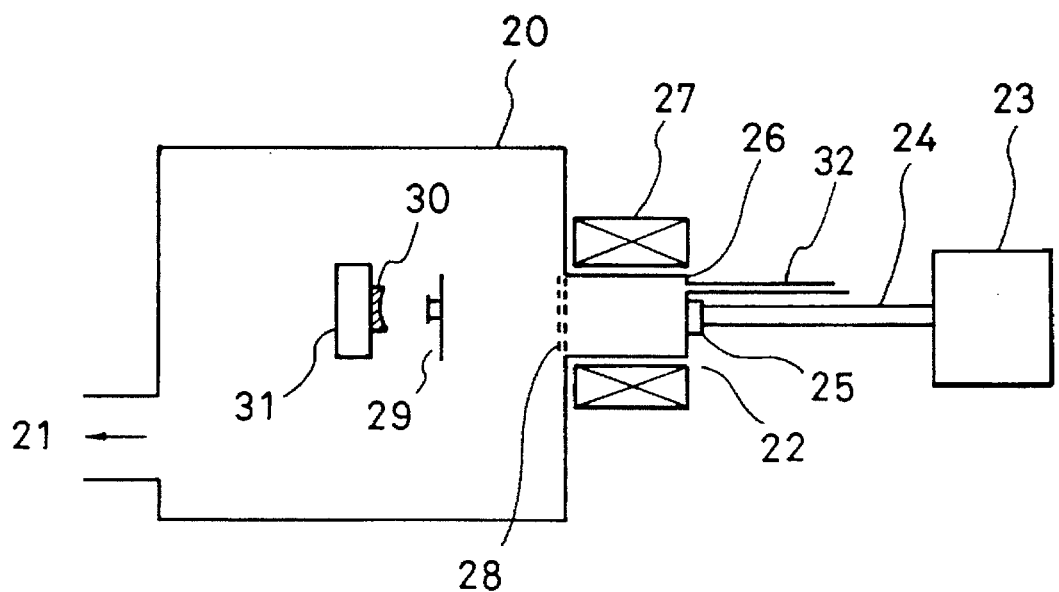
FIG. 10 is a schematic view of an ion beam film-forming device having an Electronic Cyclotron Resonance (ECR) ion source used in an embodiment of the present invention.

A carbon film having a thickness of 50 nm was formed using a matrix similar to that in the first example by a film-forming device provided with an Electron Cyclotron Resonance (ECR) ion source illustrated in FIG. 10. The film-forming device includes a vacuum tank 20, an evacuation system 21, an ECR ion source 22, a microwave oscillator 23, a microwave guide 24, a microwave introduction window 25, a cavity resonator-type plasma chamber 26, an external magnetic field 27, an induction electrode 28, a shutter doubling as a Faraday cup 29, a base holder 31 and a gas introduction system 32. Reference numeral 30 indicates a mold matrix. After the matrix 30 was first placed in the base holder 31, the device was evacuated to a pressure of $5 \times 10^{-6}$ Torr and an Ar gas was introduced into the ion source 22 from the gas introduction system 32. The surface of the matrix was cleaned and had its oxidation film removed by the resultant Ar ion beam at a vacuum degree of $3 \times 10^{-4}$ Torr and an ion current of 7 mA. Subsequently, 35 sccm of $C_2H_6$ and 10 sccm of $H_2$ were introduced into the ion source 22 from the gas introduction system 32, and 800 W microwave at 2.45 GHz was applied to the ion source 22 by the microwave oscillator 23 and the microwave guide 24, thereby forming ECR plasma in the plasma chamber 26. This was performed under the ECR conditions for which the magnetic induction was 1600 Gauss at the microwave introduction window 25 and 875 Gauss in the position 50 mm away from the induction electrode 28 to the introduction window 25 by the external magnetic field 27. Then, a voltage of 10 kV was applied to the ion induction electrode 28 so as to induce an ion beam with which the matrix was irradiated, thus preparing mold No.1. This was performed under the following conditions: the ion current density was set to be 1.0 mA/cm² by the Faraday cup; the vacuum degree was set to be $3 \times 10^{-3}$ Torr; and the base was set at room temperature. By use of the same device, voltages of 1 kV, 3 kV, 4.9 kV, 5.0 kV and 25.5 kV were applied to the ion induction electrode 28 so as to induce an ion beam and to apply it to the matrix, thus preparing molds Nos. 2, 3, 4, 5 and 6. This was performed under the following conditions: the ion current density of molds Nos. 2, 3, 4, 5 and 6 was set to be 0.2, 0.25, 0.3, 0.32, 1.8 mA/cm², respectively, by the Faraday cup; the vacuum degree was set to be $3 \times 10^{-3}$ Torr; the base was set at room temperature; and the irradiation duration was controlled so that the film thickness would be 50 nm. As in the first example, these molds were used 1000 times for molding crown glass SK12 (having a softening point Sp of 672° C. and a glass transition point Tg of 550° C.) by the molding device illustrated in FIG. 9. Concerning each of the molds, the original surface configuration, the surface roughness after performing molding 1000 times, and the molding results are shown in Table 1.

TABLE 1

| Mold No. | Film surface configuration Projection pitch/height | Surface roughness of mold (Rmax.) | Molding properties |
| --- | --- | --- | --- |
| 1 | 15 nm/25 nm | ≦0.03 μm | Good |
| 2 | Smooth | ≦0.01 μm | Film peeling |
| 3 | Smooth | ≦0.01 μm | Slight film peeling |
| 4 | 50 nm/10 nm | ≦0.02 μm | Slight film peeling |
| 5 | 25 nm/10 nm | ≦0.02 μm | Good |
| 6 | 40 nm/50 nm | ≧0.06 μm | Clouding, film peeling |

The molding surfaces of the molds were observed with an optical microscope and a scanning electron microscope (SEM). As a result, no defects, such as scratches and cracks, were detectable on molds Nos. 1 and 5 as well as the first example. Moreover, Pb, which was reduced and precipitated from PbO contained in the glass, nor was glass adhering to the mold detectable on such molds. Also, the resultant moldings formed by molds Nos. 1 and 5 had suitable surface roughness, less profile irregularity, and good permeability and configuration precision, free from Pb precipitation and gas remainders during molding. Partial film peeling occurred on mold No. 2 after molding was performed 200 times, while slight film peeling occurred on molds Nos. 3 and 4 after molding was performed 500 times and 800 times, respectively. The surface of mold No. 6 was considerably rough and the molding surface became cloudy due to scattering. Partial film peeling occurred on mold No. 6 after molding was performed 800 times.

THIRD EXAMPLE

A sintered material consisting of WC(84%)-TiC(8%)-TaC (8%) was machined to a predetermined configuration as a matrix, and the molding surface was mirror-polished to Rmax.=0.02 μm. Ti having a thickness of 200 nm was formed on the molding surface of the matrix according to an ion plating process, followed by forming TiN having a thickness of 1800 nm. A carbon film was formed on the molding surface under the same process and conditions as those in the first example.

The above-noted mold was used 1000 times to mold crown glass SK12 (having a softening point Sp of 672° C. and a glass transition point Tg of 550° C.) by the molding device shown in FIG. 7, as in the first example. Results similar to those in the first example were obtained.

Instead of using TiN, an intermediate layer may be formed using: Si, Al, metals of the 4A, 5A and 6A groups of the periodical table; carbides, nitrides, carbonitrides, carboxides, carboxide nitrides, borides, and boronitrides of these metals; boron carbides and boron nitrides; and compounds and mixtures containing at least one thereof. Results similar to those obtained by using TiN were realized.

FOURTH EXAMPLE

A matrix similar to that in the first example was used. Prior to the formation of a carbon film, the matrix was soaked in an alcohol solution in which diamond abrasive grains having a grain size of 1 μm or smaller were dispersed so as to cause ultrasonic vibration, thereby scratching the surface of the matrix. The surface of the matrix was observed with an AFM so as to show that 25 nm-high projections were detectable at a pitch of 20 nm. After the matrix was sufficiently washed, it was placed in the ion beam deposition device used in the first example. A carbon film having a thickness of 100 nm was formed under the same conditions as those in the first example, other than that an ion beam to be induced was set to have an energy of 0.8 keV and a current density of 0.7 mA/cm$^2$; and the base was heated at a temperature of 300° C. The resultant film surface was observed with the AFM so as to show that the surface of the matrix had substantially the same configuration as that of the surface immediately after being scratched.

Subsequently, as in the first example, the above-noted mold was used 1000 times to mold crown glass SK12 (having a softening point Sp of 672° C. and a glass transition point Tg of 550° C.) by the molding device illustrated in FIG. 7. Results similar to those in the first example were obtained.

Further, instead of the ion beam deposition process, other processes, such as ion plating, DC plasma CVD, RF plasma CVD, microwave plasma CVD, ECR plasma CVD and plasma sputtering, were employed whereby the carbon films were similarly formed on the matrixes. Results similar to those in the first example were also obtained.

As will be clearly understood from the foregoing description, the present invention offers the following advantages.

The carbon film was formed such that a plurality of projections having an average height of a range from 0.5 to 30 nm were serially provided at an average pitch of from 5 to 30 nm. Such a form decreased the surface energy and the frictional coefficient of the film and increased adhesion of the film to the matrix. At the same time, the surface roughness of a resultant optical element was prevented from being deteriorated, thus avoiding glass from adhering to the mold and preventing reaction products, thereby maintaining good releasability between the mold and glass for a long period. As a result, a mold having a highly-durable mirror surface, free from film peeling and cracks in the formation of glass, was obtained.

The carbon film was set to have a thickness from 1 to 100 nm and to have a gradient of carbon atom concentration which is higher near the surface of the film and lower near the matrix, thereby inhibiting the production of reaction precipitates with glass components and enhancing releasability between the mold and glass.

The use of such a mold enables improvements in productivity and cost reduction.

Also, the above-noted mold was formed on the surface of the matrix by employing a carbon ion beam having an ion energy of from 5 to 25 keV via an intermediate layer or without such a layer, thereby enhancing the efficient formation of a carbon film serially provided with specifically-shaped projections.

Alternatively, it was possible to provide similarly-shaped projections for the above-noted optical element mold by a relatively thin carbon film according to the following process. After projections and depressions were formed on the surface of the matrix, a carbon film was formed thereon using a carbon ion beam having an ion energy of from 0.2 to 1.5 keV via an intermediate layer or without such a layer.

From the advantages actually obtained through the foregoing examples, the present invention provides a mold having good characteristics concerning molding, durability and cost efficiency, the mold being particularly suitable for molding optical elements. The invention also provides a method of manufacturing such a mold.

Further, the present invention provides a mold with a molding surface coated with a film free from peeling and cracks, and problems peculiar to conventional coating films, such as carbon films, thereby preventing an adverse influence on a material to be molded. The invention also provides a method of manufacturing such a mold.

Still further, the present invention provides a mold which prevents a material from adhering to the mold and so as not to spoil the outer appearance of precision parts, such as optical elements. The invention also provides a method of manufacturing such a mold.

In addition, the present invention provides a mold free from problems which might be caused by a heat cycle in the course of molding, and also provides a method of manufacturing such a mold.

Also, the present invention provides a mold having a highly-durable mirror surface on the molding surface, and also provides a method of manufacturing such a mold.

Further, the present invention provides a mold which is capable of improving the overall productivity and yield and realizing a cost reduction, and also provides a method of manufacturing such a mold.

Still further, the present invention provides a simple mold manufacturing method employed whereby a conventional film-forming device can be utilized.

While the present invention has been described with reference to what are presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A mold comprising: a matrix, a molding surface of said mold and a carbon film on said molding surface of said mold, said carbon film having a thickness from 1 to 100 nm and being formed so that a plurality of projections having an average height ranging from 0.5 to 30 nm are serially arranged on said molding surface at an average pitch ranging from 5 to 30 nm.

2. A mold according to claim 1, wherein said carbon film is directly formed on a matrix of said mold.

3. A mold according to claim 1, wherein said carbon film is disposed on an intermediate layer formed on said matrix.

4. A mold according to claim 1, wherein the content concentration of carbon atoms varies along the surface of said carbon film to the interface between said carbon film and the matrix.

5. A mold according to claim 4, wherein said content concentration of carbon atoms is higher adjacent to the surface of said carbon film than near the matrix.

6. A mold according to claim 1, wherein the content concentration of carbon atoms contained in said carbon film is 100% on the surface.

7. A mold according to claim 1, wherein said carbon film is formed of an amorphous material.

8. A mold according to claim 7, wherein said amorphous material is selected from the group consisting of a diamond like carbon film, an amorphous hydrogenated carbon film and a hard carbon film.

9. A mold according to claim 1, wherein said carbon film is a polycrystalline material.

10. A mold according to claim 9, wherein said polycrystalline material is a diamond film.

11. A mold according to claim 1, wherein the surface of a matrix of said mold corresponding to said molding surface is shaped such that a plurality of projections having an average step of 0.5 to 30 nm are arranged at an average pitch of from 5 to 30 nm.

12. A mold according to claim 1, wherein said matrix of said has a material selected from the group consisting of WC, SiC, TiC, TaC, BiN, TiN, AlN, $Si_3N_4$, $SiO_2$, $Al_2O_3$, $ZrO_2$, W, Ta, Mo, cermet, SIALON, mullite, WC-Co alloy.

13. A mold according to claim 3, wherein said intermediate layer is formed of a material selected from the group consisting of: Si, Al, metals of the IVA, VA and VIA groups of the periodical table; carbides, nitrides, carbonitrides, carboxides, carboxide nitrides, borides, and boronitrides of the metals; boron oxides and boron nitrides; and compounds and mixtures containing at least one thereof.

14. A mold according to claim 3, wherein said intermediate layer has a thickness of from 5 to 100 nm.

15. A mold according to claim 1, wherein said mold is used for molding an optical element.

16. A mold according to claim 1, wherein said optical element is glass.

17. A mold according to claim 1, wherein said mold is used for performing press-molding.

18. A method of manufacturing a mold, comprising the step of irradiating a molding surface of said mold with a carbon ion beam having an ion energy of from 5 to 25 keV so as to form a carbon film from +100 nm in thickness on which a plurality of projections having an average height of from 0.5 to 30 nm are arranged at an average pitch of from 5 to 30 nm.

19. A method of manufacturing a mold, comprising the steps of:

surface treating a molding surface of said mold so as to form a surface on which a plurality of projections having an average height of from 0.5 to 30 nm are serially arranged at an average pitch of from 5 to 30 nm; and forming a carbon film from +100 nm in thickness on said molding surface by using a carbon ion beam having an ion energy of from 0.2 to 1.5 keV.

* * * * *

UNITED STATES PATENT AND TRADEMARK OFFICE
CERTIFICATE OF CORRECTION

PATENT NO. : 5,662,999
DATED : September 2, 1997
INVENTOR(S) : YASUSHI TANIGUCHI, ET AL.

It is certified that error appears in the above-identified patent and that said Letters Patent is hereby corrected as shown below:

On the title page: Item [56]

AT [56] REFERENCES CITED

FOREIGN PATENT DOCUMENTS

"1301864 12/1989 Japan" should read
--1-301864 12/1989 Japan--; and

"2-31012 7/1990 Japan" should read
--2-31012 2/1990 Japan--.

COLUMN 7

Line 54, "does" should read --do--.

COLUMN 8

Line 44, "also" should read --also be--.

COLUMN 15

Line 34, "said" should read --said mold--.

UNITED STATES PATENT AND TRADEMARK OFFICE
CERTIFICATE OF CORRECTION

PATENT NO. : 5,662,999

DATED : September 2, 1997

INVENTOR(S) : YASUSHI TANIGUCHI, ET AL.        Page 2 of 2

It is certified that error appears in the above-identified patent and that said Letters Patent is hereby corrected as shown below:

<u>COLUMN 16</u>

Line 20, "+100 nm" should read --1-100 nm--; and
    Line 32, "+100 nm" should read --1-100 nm--.

Signed and Sealed this

Thirty-first Day of March, 1998

Attest:

BRUCE LEHMAN

Attesting Officer        Commissioner of Patents and Trademarks